United States Patent
Shelnut et al.

(10) Patent No.: US 6,824,665 B2
(45) Date of Patent: Nov. 30, 2004

(54) SEED LAYER DEPOSITION

(75) Inventors: James G. Shelnut, Northboro, MA (US); David Merricks, Coventry (GB); Oleh B. Dutkewych, Chatham, MA (US); Charles R. Shipley, Auburndale, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 312 days.

(21) Appl. No.: 09/978,797

(22) Filed: Oct. 17, 2001

(65) Prior Publication Data

US 2002/0066671 A1 Jun. 6, 2002

Related U.S. Application Data

(60) Provisional application No. 60/243,086, filed on Oct. 25, 2000.

(51) Int. Cl.$^7$ .................. C23C 28/02; H01L 21/288
(52) U.S. Cl. .................. 205/102; 205/123; 205/191; 205/291; 205/916; 427/96; 427/305; 427/437; 427/443.1; 438/622; 438/627; 438/678; 438/687
(58) Field of Search .................. 205/102, 104, 205/123, 157, 191, 291, 916; 427/96, 305, 437, 443.1; 438/622, 627, 678, 687

(56) References Cited

U.S. PATENT DOCUMENTS 3,243,361 A * 3/1966 Clark .................. 205/147
4,305,792 A * 12/1981 Kedward et al. .......... 205/109
4,592,808 A *  6/1986 Doubt .................. 205/102
4,671,968 A *  6/1987 Slominski .............. 427/457
5,660,706 A *  8/1997 Zhao et al. ............. 205/123
6,110,817 A     8/2000 Tsai et al.
6,136,707 A    10/2000 Cohen
6,224,737 B1    5/2001 Tsai et al.
6,261,433 B1    7/2001 Landau
6,267,853 B1 *  7/2001 Dordi et al. ............ 204/232
6,300,244 B1 * 10/2001 Itabashi et al. .......... 438/678
6,319,831 B1   11/2001 Tsai et al.

FOREIGN PATENT DOCUMENTS

WO     WO 99/31300     12/1998

OTHER PUBLICATIONS

Frederick A. Lowenheim, Electroplating, McGraw–Hill Book Company, New York, 1978, pp 16–25.*

* cited by examiner

Primary Examiner—Roy King
Assistant Examiner—William T. Leader
(74) Attorney, Agent, or Firm—S. Matthew Cairns

(57) ABSTRACT

Disclosed are methods for depositing a copper seed layer on a substrate having a conductive layer. Such methods are particularly suitable for depositing a copper seed layer on a substrate having small apertures, and preferably very small apertures.

14 Claims, No Drawings

SEED LAYER DEPOSITION

This application claims the benefit of U.S. Provisional Application No. 60/243,086 filing date Oct. 25, 2000.

BACKGROUND OF THE INVENTION

The present invention relates generally to the to the field of seed layers for subsequent metallization. In particular, this invention relates to methods for depositing seed layers prior to metallization.

The trend toward smaller microelectronic devices, such as those with sub-micron geometries, has resulted in devices with multiple metallization layers to handle the higher densities. One common metal used for forming metal lines, also referred to as wiring, on a semiconductor wafer is aluminum. Aluminum has the advantage of being relatively inexpensive, having low resistivity, and being relatively easy to etch. Aluminum has also been used to form interconnections in vias to connect the different metal layers. However, as the size of via/contact holes shrinks to the sub-micron region, a step coverage problem appears which in turn can cause reliability problems when using aluminum to form the interconnections between the different metal layers. Such poor step coverage results in high current density and enhances electromigration.

One approach to providing improved interconnection paths in the vias is to form completely filled plugs by using metals such as tungsten while using aluminum for the metal layers. However, tungsten processes are expensive and complicated, tungsten has high resistivity, and tungsten plugs are susceptible to voids and form poor interfaces with the wiring layers.

Copper has been proposed as a replacement material for interconnect metallizations. Copper has the advantages of improved electrical properties as compared to tungsten and better electromigration property and lower resistivity than aluminum. The drawbacks to copper are that it is more difficult to etch as compared to aluminum and tungsten and it has a tendency to migrate into the dielectric layer, such as silicon dioxide. To prevent such migration, a barrier layer, such as titanium nitride, tantalum nitride and the like, must be used prior to the depositing of a copper layer.

Typical techniques for applying a metal layer, such as electrochemical deposition, are only suitable for applying copper to an electrically conductive layer. Thus, an underlying conductive seed layer, typically a metal seed layer such as copper, is generally applied to the substrate prior to electrochemically depositing copper. Such seed layers may be applied by a variety of methods, such as physical vapor deposition ("PVD") and chemical vapor deposition ("CVD"). Typically, seed layers are thin in comparison to other metal layers, such as from 50 to 1500 angstroms thick. Such metal seed layers, particularly copper seed layers, may suffer from problems such as metal oxide both on the surface of the seed layer and in the bulk of the layer as well as discontinuities in the layer.

Discontinuities or voids are areas in the seed layer where coverage of the metal, such as copper, is incomplete or lacking. Such discontinuities can arise from insufficient blanket deposition of the metal layer, such as depositing the metal in a line of sight fashion. In order for a complete metal layer to be electrochemically deposited on such a seed layer, the discontinuities must be filled in prior to or during the deposition of the final metal layer, or else voids in the final metal layer may occur. For example, PCT patent application number WO 99/47731 (Chen) discloses a method of providing a seed layer by first vapor depositing an ultra-thin seed layer followed by electrochemically enhancing the ultra-thin seed layer to form a final seed layer. According to this patent application, such a two step process provides a seed layer having reduced discontinuities, i.e. areas in the seed layer where coverage of the seed layer is incomplete or lacking.

Physical or chemical vapor deposition methods are complicated and difficult to control. Further, PVD methods tend to deposit metal in a line of sight fashion. Electroless deposition, unlike PVD or CVD, tends to be more conformal, thus providing better aperture sidewall coverage leading to a more continuous seed layer and, consequently, reduced void formation following subsequent electroplating.

There is a need for methods of depositing substantially continuous seed layers that conform to surface geometries in electronic devices, particularly in devices having very small geometries such as 0.5 micron and below.

SUMMARY OF THE INVENTION

It has been surprisingly found that a substantially continuous seed layer can be deposited in one step according to the present method. Such method provides substantially continuous seed layers that conform to the surface geometries of the substrate, particularly on substrates having apertures $\leq 1$ $\mu$m.

In one aspect, the present invention provides a method for depositing a seed layer including the steps of: contacting a substrate having a conductive layer and apertures of $\leq 1$ $\mu$m with an electroless copper plating bath; subjecting the substrate to a low current density for a period of time to initiate plating of copper on the conductive layer; discontinuing the current; and continuing to plate electrolessly to provide a copper seed layer.

In a second aspect, the present invention provides a method for manufacturing an electronic device including the step of providing a copper seed layer including the steps of: contacting an electronic device substrate having a conductive layer and apertures of $\leq 1$ $\mu$m with an electroless copper plating bath; subjecting the electronic device substrate to a low current density for a period of time to initiate plating of copper on the conductive layer; discontinuing the current; and continuing to plate electrolessly to provide the copper seed layer.

In a third aspect, the present invention provides a method of enhancing a discontinuous seed layer disposed on a substrate including the steps of: contacting a substrate having a discontinuous seed layer with an electroless copper plating bath; subjecting the substrate to a low current density for a period of time to initiate plating of copper on the conductive layer; discontinuing the current; and continuing to plate electrolessly to provide a substantially continuous seed layer.

DETAILED DESCRIPTION OF THE INVENTION

The following abbreviations shall have the following meanings unless the text clearly indicates otherwise: nm=nanometers; $\mu$m=micron=micrometer; nm=nanometer; ° C.=degrees Centigrade; g/L=grams per liter; mA/cm$^2$=milliamperes per square centimeter; M=molar; and ppm=parts per million.

As used throughout the specification, "feature" refers to the geometries on a substrate, such as, but not limited to, trenches and vias. "Apertures" refer to recessed features, such as vias and trenches. The term "small features" refers to features that are one micron or smaller in size. "Very small features" refers to features that are one-half micron or smaller in size. Likewise, "small apertures" refer to apertures that are one micron or smaller ($\leq 1$ μm) in size and "very small apertures" refer to apertures that are one-half micron or smaller ($\leq 0.5$ μm) in size. As used throughout this specification, the term "plating" refers to metal electroplating, unless the context clearly indicates otherwise. "Deposition" and "plating" are used interchangeably throughout this specification. "Halo" refers to fluoro, chloro, bromo, and iodo. Likewise, "halide" refers to fluoride, chloride, bromide and iodide. "Alkyl" includes straight chain, branched and cyclic alkyl groups.

All percentages and ratios are by weight unless otherwise indicated. All ranges are inclusive and combinable.

The present invention provides a method for depositing a seed layer including the steps of: contacting a substrate having a conductive layer and apertures of $\leq 1$ μm with an electroless copper plating bath; subjecting the substrate to a low current density for a period of time to initiate plating of copper on the conductive layer; discontinuing the current; and continuing to plate electrolessly to provide a copper seed layer. The present invention is suitable for depositing a seed layer on a variety of substrates, particularly those used in the manufacture of electronic devices.

Suitable substrates are any that contain a conductive layer for subsequent electrodeposition of a metal. Particularly suitable substrates are wafers used in the manufacture of integrated circuits and semiconductors, printed wiring board inner layers and outer layers, flexible circuits and the like. It is preferred that the substrate is a wafer. Exemplary substrates include, but are not limited to, those containing one or more apertures having a size of $\leq 1$ μm, particularly $\leq 0.5$ μm, and more particularly $\leq 0.18$ μm.

Typical conductive layers include barrier layers, such as those used in the manufacture of integrated circuits. Such conductive layers only need to be sufficiently conductive to provide for plating initiation by application of a potential to the conductive layer. Suitable barrier layers include those containing one or more of cobalt, cobalt-tungsten-phosphorus, tungsten, tungsten nitride or titanium nitride.

A wide variety of electroless copper plating baths may be used according to the present method. In general, such electroless plating solutions typically contain copper ions, one or more reducing agents and optionally a complexing agent. Typically, electroless plating solutions are aqueous, but may also contain one or more organic solvents.

The copper ions may be present in the electroless plating baths in any soluble form, such as copper nitrate, copper sulfate, copper sulfamate, copper sulfonate, copper alkylsulfonate, copper arylsulfonate, copper halides, copper fluoroborate, copper gluconate, copper acetate, copper formate and the like. The amount of such copper ions depends upon the particular electroless bath used. Such amounts are within the ability of one skilled in the art and are typically sufficient to provide an amount of copper metal (zerovalent copper) in the range of from about 1 to about 5 g/L, and preferably from about 2 to about 3 g/L.

A wide variety of reducing agents may be used in such electroless baths. Suitable reducing agents include, but are not limited to, sodium hypophosphite, potassium hypophosphite, sodium borohydride, formaldehyde, dimethylamine borane, trimethylamine borane, methylmorpholino borane, morpholino borane, diisopropylamine borane, L-sodium ascorbate, sodium phosphite, potassium phosphite, tartaric acid, glucose, glycerine, sodium N,N-diethylglycine, sodium formate, potassium formate, titanium trichloride, hydrazine, thiourea, methylthiourea, N-methylthiourea, N-ethylthiourea, hydroquinone, bivalent cobalt compounds, and the like. Formaldehyde, dimethylamine borane and sodium borohydride are preferred. The amount of such reducing agent in the electroless bath is well known to those skilled in the art and depends upon the particular reducing agent selected and whether the electroless bath is a fast or slow copper electroless plating bath. For example, when formaldehyde is used as the reducing agent, it is typically used in the range of from about 1 to about 15 g/L and preferably from about 6 to about 12 g/L.

Optionally, the electroless baths may contain one or more complexing agents, such as ethylenediamine, ethylenediaminetetraacetic acid ("EDTA"), tetramethylenediamine, citrate salts, tartrate salts such as Rochelle salts, and the like.

The copper electroless plating baths are typically alkaline and preferably highly alkaline. Thus, such electroless baths typically contain one or more bases. Suitable bases include alkali metal hydroxides, ammonium hydroxides, tetra ($C_1$–$C_4$)alkylammonium hydroxides and the like. Preferred bases include sodium hydroxide, potassium hydroxide, lithium hydroxide and tetramethylammonium hydroxide. Such bases are added to the electroless copper plating baths in sufficient amount to provide the desired alkalinity. Typically, such bases are added in amounts sufficient to provide a pH in the range of from about 7.5 to about 14, preferably from about 8 to about 13.5, and more preferably from about 8.5 to about 13.

The substrate having a conductive layer is typically contacted with a copper electroless plating bath in a variety of ways, such as by immersion, spraying, spin coating, flood coating and the like. Upon contact with the electroless copper bath, the substrate is subjected to a low current density for a period of time to initiate plating of copper on the conductive layer, after which time the current is discontinued and the seed layer is allowed to plate electrolessly. Only a low current density is need to initiate plating in electroless copper baths. Suitable current density is any up to about 10 mA/cm$^2$ and preferably up to about 5 mA/cm$^2$. Such low current density is typically applied for up to about 30 seconds in to initiate plating, and preferably for about 10 to about 30 seconds. While not wishing to be bound by theory, it is believed that the application of such low current density initiates the electrodeposition of copper seed crystals onto the conductive layer which act as catalytic sites for electroless copper deposition.

After the current is discontinued, the substrate containing the conductive layer typically remains in contact with the electroless plating bath for a time sufficient to deposit the desired copper seed layer. Suitable plating times are typically at least about 0.5 minutes, preferably at least about 1 minute, and more preferably at least about 5 minutes. Other suitable plating times include at least about 20 minutes. There is no real upper limit to the plating time used. The longer such electroless plating is done, the thicker the resulting metal deposit. It will be appreciated by those skilled in the art that the plating rate may slow as the thickness of the deposit increases. Typically, such electroless plating may be performed at a temperature from below room temperature to about 95° C., and preferably from 25° to 80° C. Such times and temperatures vary according to the particular electroless plating bath used.

Once the desired copper seed layer is obtained, the substrate may be removed from contact with the electroless plating bath and optionally rinsed. The seed layer containing substrate may then be further plated to substantially fill or completely fill the apertures, such as by contacting the seed layer with an electroplating bath, preferably a copper electroplating bath. A particularly suitable electroplating bath is ULTRAFILL™ 2001 EP copper deposition chemistries, available from Shipley Company (Marlborough, Mass.). Copper electroplating baths typically contain one or more sources of copper ions and an electrolyte. Preferably the electrolyte is acidic. The amounts of copper and electrolyte may vary over a wide range and are well within the ability of one skilled in the art. Such electroplating baths may optionally contain one or more additives, such as halides, accelerators or brighteners, suppressors, levelers, grain refiners, wetting agents, surfactants and the like. The amounts of such additives are well within the ability of those skilled in the art.

In an alternative embodiment, the substrate may remain in the electroless copper bath until the desired thickness of copper is obtained. In this way, the substrate containing the copper seed layer is not isolated, rather a copper metal layer of desired thickness is deposited directly on the conductive layer. In the manufacture of integrated circuits, such a method is advantageous because a separate seed layer step may be avoided. Thus a copper layer of a thickness sufficient to substantially or completely fill the apertures in the substrate (wafer) may be deposited directly on a barrier layer.

The present invention is also suitable for enhancing a discontinuous metal seed layer on a substrate. By "enhancing" a discontinuous metal seed layer is meant that the seed layer is repaired or extended to substantially fill in, and preferably completely fill in, such discontinuities or areas devoid of seed layer. Thus, the present invention further provides a method of enhancing a discontinuous seed layer disposed on a substrate including the steps of: contacting a substrate having a discontinuous seed layer with an electroless copper plating bath; subjecting the substrate to a low current density for a period of time to initiate plating of copper on the conductive layer; discontinuing the current; and continuing to plate electrolessly to provide a substantially continuous seed layer.

The present invention may be used to enhance seed layers deposited by vapor deposition processes, such as CVD or PVD or by any other deposition means. Preferably, such seed layers are copper or copper alloy. It is further preferred that such seed layers are disposed on wafers used in the manufacture of integrated circuits.

An advantage of the present invention is that the use of typical electroless catalysts, such as palladium and palladium/tin, is avoided. A further advantage is that the resulting seed layer is substantially continuous and preferably continuous. That is, seed layers enhanced and/or deposited according to the present invention cover >95% of the surface area of the substrate, preferably >98%, and more preferably >99%. Such seed layers are also uniform due to electroless deposition being conformal.

The seed layers of the present invention may be deposited on a wide variety of substrates, as discussed above. The methods of the invention are particularly useful to provide seed layers for subsequent electroless or electrolytic plating of difficult work pieces, such as circuit board substrates with small diameter, high aspect ratio microvias and other apertures. The methods of the invention are also particularly useful for depositing seed layers on integrated circuit devices, such as formed semiconductor devices and the like. The methods of the present invention are particularly suitable for providing substantially continuous seed layers on substrates having high aspect ratio microvias and trenches, such as those having aspect rations of 4:1 or greater.

As discussed above, aspect ratios of at least 4:1, having diameters of about 200 nm or smaller can be effectively copper plated with no defects (e.g. no voids or inclusions by ion beam examination) on the substantially continuous seed layers of the invention. Seed layers on substrates including apertures with diameters below 150 nm, or even below about 100 nm, and aspect ratios of 5:1, 6:1, 7:1, 10:1 or greater, and even up to about 15:1 or greater can be deposited or effectively enhanced using the present invention. The present invention is particularly suitable for depositing and repairing seed layers on substrates having 0.18 $\mu$m and smaller apertures.

After metallization, i.e. filling of the apertures, the substrate, in the case of a wafer, is preferably subjected to chemical-mechanical planarization ("CMP"). A CMP procedure can be conducted in accordance with the invention as follows.

The wafer is mounted in a wafer carrier which urges the wafer against the surface of a moving polishing pad. The polishing pad can be a conventional smooth polishing pad or a grooved polishing pad. Suitable grooved polishing pads are those available from Rodel, Inc. (Newark, Del.). The polishing pad can be located on a conventional platen which can rotate the polishing pad. The polishing pad can be held on the platen by a holding means such as, but not limited to, an adhesive, such as, two faced tape having adhesive on both sides.

A polishing solution or slurry is fed onto the polishing pad. The wafer carrier can be at different positions on the polishing pad. The wafer can be held in position by any suitable holding means such as, but is not limited to, a wafer holder, vacuum or liquid tensioning such as, but not limited to a fluid such as, but not limited to water. If the holding means is by vacuum then there is preferably a hollow shaft which is connected to the wafer carrier. Additionally, the hollow shaft could be used to regulate gas pressure, such as, but not limited to air or an inert gas or use a vacuum to initially hold the wafer. The gas or vacuum would flow from the hollow shaft to the carrier. The gas can urge the wafer against the polishing pad for the desired contour. The vacuum can initially hold the wafer into position in the wafer carrier. Once the wafer is located on top of the polishing pad the vacuum can be disengaged and the gas pressure can be engaged to thrust the wafer against the polishing pad. The excess or unwanted copper is then removed. The platen and wafer carrier can be independently rotatable. Therefore, it is possible to rotate the wafer in the same direction as the polishing pad at the same or different speed or rotate the wafer in the opposite direction as the polishing pad.

Thus, the present invention provides a method for removing excess material from a semiconductor wafer containing one or more apertures of $\leq 1$ $\mu$m by using a chemical mechanical planarization process which includes contacting the semiconductor wafer with a rotating polishing pad thereby removing the excess material from the semiconductor wafer; wherein the apertures contain a seed layer deposit obtained from contacting a substrate having a conductive layer and apertures less than or equal to 1 $\mu$m with an electroless copper plating bath; subjecting the substrate to a low current density for a period of time to initiate plating of copper on the conductive layer; discontinuing the current; and continuing to plate electrolessly to provide a copper seed layer.

EXAMPLE 1

A copper bath is prepared containing 2 g/L copper sulfate, 18 g/L tetramethylammonium hydroxide, 3.5 g/L formaldehyde, 40 g/L EDTA and <1 g/L other additives. A wafer substrate having a titanium nitride ("TiN") barrier layer deposited on it by PVD is then contacted with the copper bath at a temperature of 50° C. containing an anode. A voltage is applied to the substrate, making it the cathode, producing a current density of 5 mA/cm$^2$, for 60 seconds during which time a copper seed layer is deposited onto the barrier material. The voltage is then removed and the wafer substrate is left in contact with the copper bath for a time sufficient to deposit a copper seed layer having a thickness of about 5 to 100 nm. The substrate is then removed from the copper bath and rinsed with de-ionized water.

EXAMPLE 2

The wafer substrate from Example 1 is then annealed by placing the wafer on a hot plate for 60 seconds in an atmosphere having reduced oxygen content. The temperature of the hot plate is 200° C. The wafer substrate is then removed from the hot plate and cooled. Once cooled, the wafer substrate is then metallized by subjecting the wafer substrate to an electrolytic copper plating bath such as that sold by Shipley Company (Marlborough, Mass.) under the ULTRAFILL 2001 trademark. The wafer substrate is placed in the electrolytic plating bath for a sufficient period of time to provide the desired metallized layer. The wafer substrate is then removed from the electrolytic plating bath, rinsed with de-ionized water and subjected to further processing.

EXAMPLE 3

A copper bath is prepared containing copper chloride (10 g/L), N-hydroxyethyl ethylenediamine triacetic acid (26 g/L), sodium hypophosphite (26 g/L), in water with the pH adjusted to 9.0 by addition of tetramethylammonium hydroxide. A wafer substrate having a cobalt-tungsten-phosphide barrier layer is then contacted with the copper bath at a temperature of 50° C., and containing an anode. A voltage is then applied to the substrate, making it the cathode, producing a current density of 5 mA/cm$^2$ for 60 seconds, during which time a copper seed layer is deposited onto the barrier layer. The voltage is then removed and the wafer substrate is left in contact with the copper bath for a time sufficient to deposit a copper seed layer having a thickness of about 5 to 100 nm. The substrate is then removed from the copper bath, rinsed with de-ionized water and further processed according to the method of Example 2.

EXAMPLE 4

A 1 liter copper bath is prepared containing copper sulfate (0.04 M), N-hydroxyethyl ethylenediamine triacetic acid (0.05 M), sodium hypophosphite (0.34 M), in water with the pH adjusted to 3 by addition of dilute sulfuric acid. A wafer substrate with a TiN barrier layer is then contacted with the copper bath at a temperature of 50° C., and containing an anode. A voltage is then applied to the substrate, making it the cathode, producing a current density of 5 mA/cm$^2$ for 60 seconds, during which time a copper seed layer is deposited onto the barrier layer. The voltage is then removed and the wafer substrate is left in contact with the copper bath for a time sufficient to deposit a copper seed layer having a thickness of about 5 to 100 nm. The substrate is then removed from the copper bath, rinsed with de-ionized water and further processed according to the method of Example 2.

What is claimed is:

1. A method for manufacturing an integrated circuit comprising the steps of: providing an integrated circuit substrate comprising a discontinuous copper seed layer, a conductive layer and apertures of <1 μm; contacting the integrated circuit substrate with an electroless copper plating bath; subjecting the electronic device substrate to a low current density for a period of time to initiate plating of copper on the conductive layer; discontinuing the current; and continuing to plate electrolessly to provide a substantially continuous copper seed layer; wherein the electroless copper plating bath consists of a soluble form of copper ions, one or more reducing agents, water, one or more bases, optionally one or more complexing agents, and optionally one or more organic solvents.

2. The method of claim 1 wherein the conductive layer is a barrier layer.

3. The method of claim 2 wherein the barrier layer comprises cobalt, cobalt-tungsten-phosphorus, tungsten, tungsten nitride or titanium nitride.

4. The method of claim 1 wherein the current density is up to about 10 mA/cm$^2$.

5. The method of claim 4 wherein the current density is up to about 5 mA/cm$^2$.

6. The method of claim 1 wherein the period of time is up to about 30 seconds.

7. The method of claim 6 wherein the period of time is from about 10 to about 30 seconds.

8. The method of claim 1 wherein the substrate is a wafer.

9. A method of enhancing a discontinuous seed layer disposed on an integrated circuit substrate comprising the steps of: contacting a substrate having a conductive layer, a discontinuous copper seed layer and apertures of <1 μm with an electroless copper plating bath; subjecting the substrate to a low current density for a period of time to initiate plating of copper on the conductive layer; discontinuing the current; and continuing to plate electrolessly to provide a substantially continuous copper seed layer, wherein the electroless copper plating bath consists of a soluble form of copper ions, one or more reducing agents, water, one or more bases, optionally one or more complexing agents, and optionally one or more organic solvents.

10. The method of claim 9 wherein current density is up to about 10 mA/cm$^2$.

11. The method of claim 10 wherein the current density is up to about 5 mA/cm$^2$.

12. The method of claim 9 wherein the period of time is up to about 30 seconds.

13. The method of claim 12 wherein the period of time is from about 10 to about 30 seconds.

14. The method of claim 9 wherein the substrate is a wafer.

* * * * *